United States Patent [19]

Nishizawa et al.

[11] 4,415,937
[45] Nov. 15, 1983

[54] SOLID-STATE IMAGE STORAGE DEVICE

[75] Inventors: Jun-ichi Nishizawa, Sendai; Masahiro Konishi, Minami-ashigara, both of Japan

[73] Assignee: Fuji Photo Film Co. Ltd., Japan

[21] Appl. No.: 326,879

[22] Filed: Dec. 2, 1981

[30] Foreign Application Priority Data

Dec. 5, 1980 [JP] Japan .................. 55-171901

[51] Int. Cl.$^3$ .......................... G11B 5/00; H04N 5/76
[52] U.S. Cl. ................................ 358/335; 358/213; 358/906
[58] Field of Search ............. 358/213, 310, 906, 335, 358/209; 360/33, 38.1

[56] References Cited

U.S. PATENT DOCUMENTS 4,130,834 12/1978 Mender et al. ............. 358/906 X
4,163,256 7/1979 Adcock ..................... 358/906 X

FOREIGN PATENT DOCUMENTS 2701630 7/1978 Fed. Rep. of Germany ...... 358/906
54-127309 10/1979 Japan ................................ 358/906

Primary Examiner—Robert L. Richardson
Attorney, Agent, or Firm—McGlew and Tuttle

[57] ABSTRACT

A solid-state image storage device employing a recording system which permits easy reproduction of an excellent image even if a relatively low-grade recording medium and recording and reproducing device are used. The solid-state image storage device is provided with a photoelectric converter having a plurality of non-destructive readout image sensor cells arranged in a predetermined form; a scanner for scanning the photoelectric converter to read out image information of the image sensor cells; and a recorder having a recording medium for recording the image information read out by the scanner. An image formed on the photoelectric converter is read out by the scanner a plurality of times and each image information thus read out is recorded at one position on the recording medium of the recorder.

8 Claims, 7 Drawing Figures

SOLID-STATE IMAGE STORAGE DEVICE

BACKGROUND OF THE INVENTION

1. Field of the Invention

The present invention relates to a solid-state image storage device which is provided with a recorder for recording, a plurality of times, an image signal picked up by an image sensor.

2. Description of the Prior Art

In recent years many proposals have been made for purely electronic reproduction of an input image through the use of photoelectric conversion elements or optoelectro transducers such as BBDs and CCDs instead of conventional cameras employing a silver salt photographic material which involves chemical treatment in reproduction of an input image, as set forth, for example, in Japanese Patent "Kokai" (Laid-Ipen) Gazette No. 52912/74. With this kind of method, however, it is general practice that an image signal obtained with the photoelectric conversion element is once recorded on a recording medium such as a magnetic tape or the like and then reproduced by a reproducing device for display on an image display device such as a television receiver set, for instance. Accordingly, an error occurs in the recording-reproducing process. Such an error, in the case of producing an output image by recording and reproducing the image signal obtained with the photoelectric conversion element, constitutes an important factor which determines the image quality of the output image, except a picture element defect of the photoelectric conversion element. Especially in a recording and reproducing device employing a magnetic tape, as noise by travel of the tape, dropout and so forth inevitably introduce errors, excellent image quality is difficult to obtain. In order to enhance the image quality, it is necessary, of course, to improve the recording and reproducing accuracy of the recording and reproducing device itself and to use a defect-free recording medium of high quality. However, this requires a high precision and complex mechanism, and hence is difficult to achieve from the technical and economical points of view, further involving the problem of the image storage device becoming bulky.

SUMMARY OF THE INVENTION

It is therefore an object of the present invention to provide a solid-state image storage device which employs such a recording system that permits easy reproduction of an excellent image even if a recording medium and a recording and reproducing device, both relatively low in quality, are used.

Another object of the present invention is to cheapen and minimize photographic equipment.

Yet another object of the present invention is to facilitate incorporation of a recording-medium cassette into an image storage device.

The above objective is achieved by the use of a semiconductor image sensor of a novel construction, already proposed by the present inventors, which permits non-destructive readout and random access and in which image information can be read out from image sensor cells repeatedly.

Briefly stated, according to the present invention, a photoelectric converter or optoelectro transducer unit has a plurality of non-destructive readout type image sensor cells arranged in a predetermined form. Image information of the photoelectric converter is read out by a scanner a plurality of times and the individual image information thus read out are recorded at different positions on a recording medium of a recorder. As the image information of the same image is recorded a plurality of times, it is possible to employ a reproducing method that obtains a reproduced image, for example, by averaging the plurality of records of the same image information, enabling substantial improvement of the image quality of the reproduced image.

DESCRIPTION OF THE PREFERRED EMBODIMENTS

Figure 1:
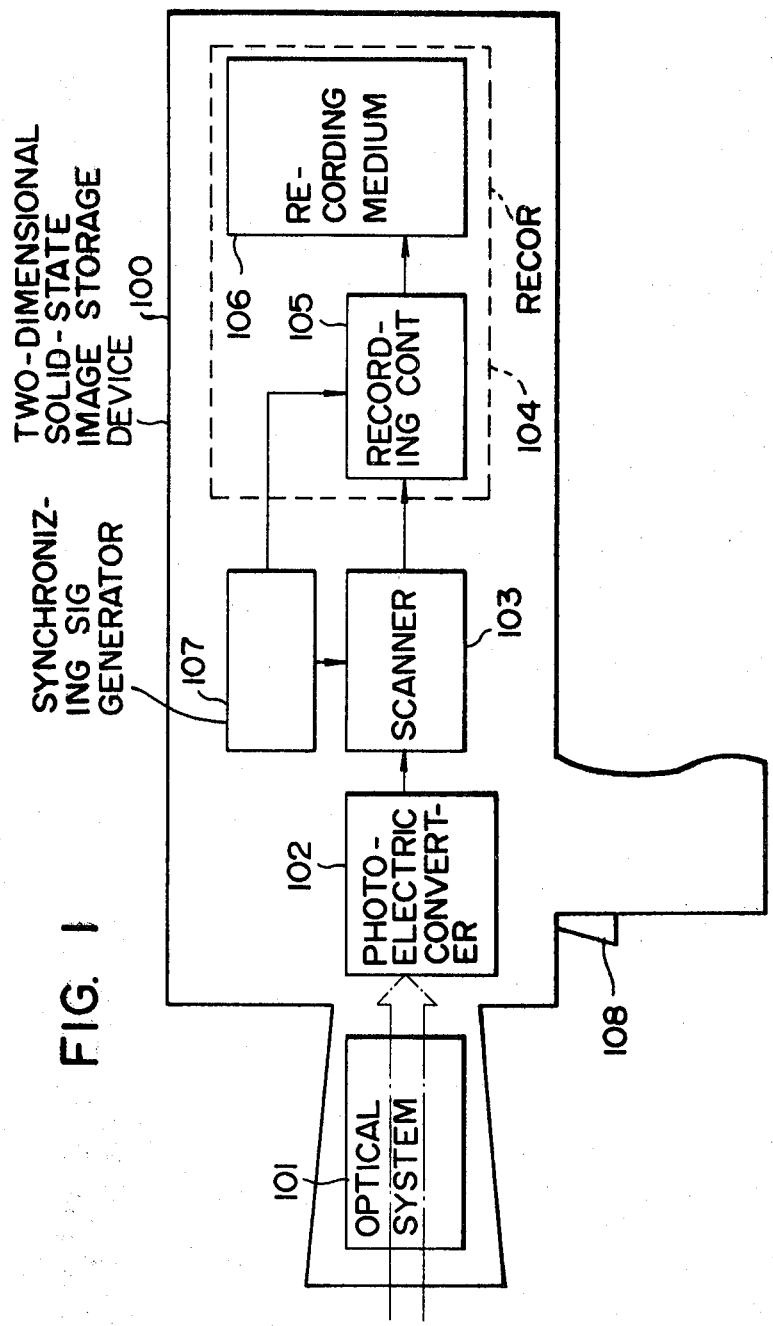
FIG. 1 is a block diagram illustrating the basic arrangement of the present invention.

FIG. 1 illustrates in block form the basic arrangement of the image storage device of the present invention. In FIG. 1, reference numeral 100 indicates a two-dimensional solid-state image sensor; 101 designates an optical system, 102 identifies a photoelectric converter or optoelectro transducer unit; 103 denotes a scanner; 104 represents a recorder; 105 shows a recording controller; 106 refers to a recording medium; 107 indicates a synchronizing signal generator; and 108 designates a shutter release.

The optical system 101 includes a lens, a diaphragm and, as required, an optical shutter. When the shutter release 108 is pressed, an input image is focused onto a photoelectric conversion surface of the photoelectric converter 102. The photoelectric converter 102 has a non-destructive readout type image sensor, such cells as described in detail later, arranged in a matrix form. The scanner 103 scans the photoelectric converter 102 to read out image information stored in the image sensor cells. The information read out by the scanner 103 is provided to the recording controller 105 of the recorder 104. The recording controller 105 records the image information on the recording medium 106 which is designed to be detachable from the body of the image storage device. During recording, it is synchronized by the synchronizing signal generator 107 with the scanning of the photoelectric converter 102.

In the above operation, the scanner 103 reads out image information of the same input image from the photoelectric converter 102 a plurality of times and the recording controller 105 records the individual image information. That is, the image information of the same image picked up by the solid-state image sensor is recorded on the recording medium 106 a plurality of times. Since the photoelectric converter 102 is constituted by the non-destructive readout image sensor cells as described above, even if information of the same image sensor cell is read out a plurality of times after closing a shutter, the content of the image sensor cell is retained. Therefore, the same image information can easily be recorded a plurality of times without involving complex means for temporarily loading the stored information of the photoelectric converter 102 in a buffer memory or the like.

By recording the same image information on the recording medium at different positions as described above, it is possible to employ such a reproducing method of obtaining a reproduced image, for example, by reproducing only a defect-free portion of the plurality of records of the image information, or averaging the plurality of records of the same image information. In this case, the image quality of the reproduced image can markedly be enhanced as compared with the image quality obtainable in the case of the image information being recorded only once. Accordingly, even if a relatively low-grade recording medium and a recording and reproducing device of relatively low quality are used, an excellent reproduced image can easily be obtained. This enables the reduction of the cost of photographic equipment and its miniaturization and, also, permits easy incorporation of a recording-medium cassette in the body of the image storage device. Besides, it is also possible to employ, as the photoelectric converter, a one-dimensional sensor having image sensor cells arranged in a line.

Figure 2:
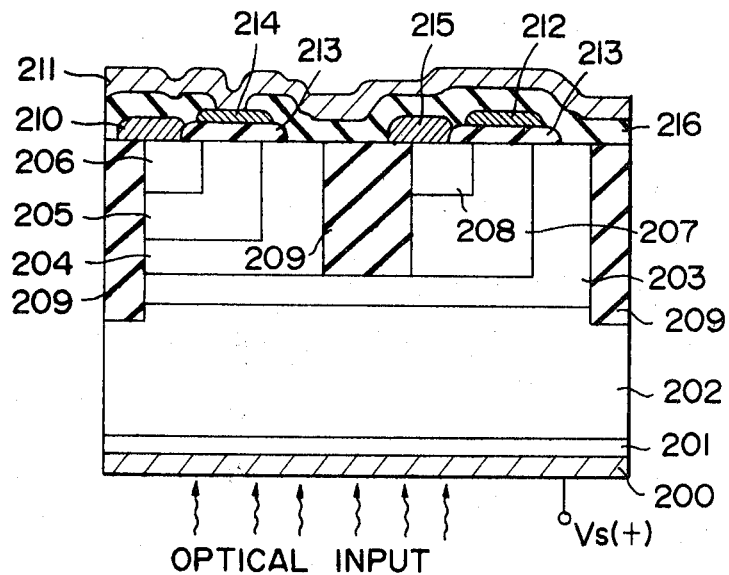
FIG. 2 is a sectional view showing an example of a non-destructive readout type image sensor cell for use in the present invention.
Figure 3:
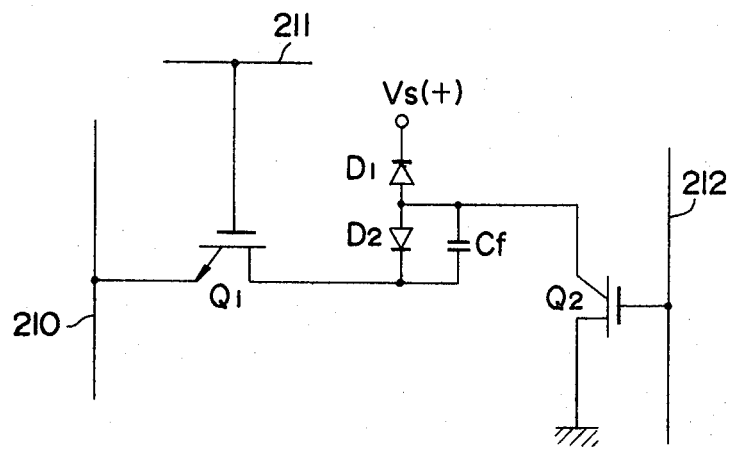
FIG. 3 is its equivalent circuit representation.

FIG. 2 illustrates in section an example of the non-destructive readout type image sensor cell for use in the present invention and FIG. 3 shows its equivalent circuit. In FIGS. 2 and 3, reference numeral 200 indicates a transparent electrode biased to a power source voltage Vs(+); 201 designates an n+ region; 202 identifies a high resistivity region, for example, a p− region; 203 denotes a p+ region; 204 represents an n+ region; 205 shows a p region (a channel region); 206 refers to an n+ source region; 207 indicates an n region (a channel region); 208 designates a p+ source region; 209 identifies an isolation region formed of an insulator; 210 denotes a bit line; 211 represents a word line; 212 shows an erase line; 213 refers to a gate insulating film; 214 indicates a gate electrode; 215 designates a grounding electrode; 216 identifies an insulating layer; $Q_1$ denotes a readout transistor; $Q_2$ represents an erasing transistor; $D_1$ and $D_2$ show diodes; and Cf refers to a capacitance. The n+ region 201, the p− region 202, the p+ region 203 and the n+ region 204 form a hook structure. The base of this overall npn structure is allowed to float electively. This hook structure is equivalently represented by a back-to-back connection of the diodes $D_1$ and $D_2$. The junction capacitance between the p+ region 203 and the n+ region 204 is represented by Cf. The n+ region 204, the p region 205 and the n+ region 206 correspond to the drain, gate and source of the readout transistor $Q_1$, respectively, and the p+ region 203, the n region 207 and the p+ region 208 correspond to the drain, gate and source of the erasing transistor $Q_2$, respectively.

Upon application of an optical input to the image sensor cell in such a state in which the predetermined voltage Vs(+) is applied to the transparent electrode 200 to deplete the p− region 202 throughout it so that carriers may travel therein at a saturated velocity, electron-hole pairs are generated in the p− region 202 in the vicinity of the n+ region 201. The electrons thus created are absorbed into the n+ region 201 but the holes are accelerated by an electric field and accumulated in the p+ region 203 to charge it positive. As a result of this, the barrier potential of the n+ region 204 for electrons drops, permitting electrons to flow out of the n+ region 204 into the p+ region 204 across the junction formed between the both regions held in the floating state. Thus, the n+ region 204 is biased positive.

The potential V(t) of the n+ region 204 is approximately given by the following expression relative to the light integration period of 0 to t sec:

$$V(t) = \frac{cq}{Cf} \int_0^t S(t)dt \quad (1)$$

where (S)t is the photon density, c is the velocity of light and q is the unit quantity of positive charges. Hence a voltage corresponding to the optical input is obtained.

Turning ON the readout transistor $Q_1$ through the word line 211, the potential on the bit line 210 varies with the voltage of the n+ region 204, so that the image information can be read out by detecting the voltage variation on the bit line. In this case, since the n+ region 204 and the p+ region 203 are both held in the floating state, the diffusion potential of the junction therebetween becomes equivalently low and, consequently, electrons having flowed into the n+ region 204 during the readout operation flow out therefrom towards the substrate across the p+ region 203. Accordingly, even after the readout transistor $Q_1$ is turned On to read out the stored content, holes of optical information accumulated in the p+ region 203 can be retained, thus enabling non-destructive readout.

As will be seen from the expression (1), the potential of the n+ region 204 assumes a value which is proportional to the integration of the photon density of the optical input with respect to time. Accordingly, taking into account this and the non-destructive readout property of the image sensor cell, it can be understood that the potential V(t) of the n+ region 204 remains proportional to the value of integration of the photon density of the optical input with respect to time even after the non-destructive readout operation. In other words, even if the image information is once read out, the amount of integration of the optical input from the start of storage can be readout again.

The potential of the n+ region 204 does not approximately depend on its capacitance but ultimately depends on the integrated value of the optical input, so that the potential of the n+ region 204 can be read out substantially as it is.

In the image sensor cell of such an arrangement as described above, only when the hook-structured light detecting portion is exposed to light and an electric field of a magnitude larger than a certain value, either electrons or holes of electron-hole pairs created in the light detecting portion can be stored in the drain region of the readout transistor.

For example, by applying a predetermined electric field to the light detecting portion for only a fixed period of time while irradiating it by light, it is possible to obtain an image signal corresponding to that specified period of time. That is to say, what is called non-mechanical shutter function can be provided. However, in the case of carrying out the non-destructive readout after exposure, it is desirable to apply an electric field of such a value that holes generated in the high resistivity layer 202 during the readout operation do not reach the p+ region and that electrons having flowed into the high resistivity layer 202 across the p+ region 203 from the n+ region 204 are directed to the substrate. (A voltage for applying this electric field will hereinafter be referred to as the readout voltage.)

The erasing transistor $Q_2$ in FIGS. 2 and 3 is held in the OFF state during exposure and readout operation and, after the readout operation, it is turned ON to erase the holes stored in the p+ region 203 in preparation for the next exposure. The charges stored in the p+ region 203, can be removed not only by the abovesaid method but also by inverting the substrate biasing voltage slightly negative or applying a high voltage to the gate electrode 214 to supply a large quantity of electrons from the bit line 210. Accordingly, it is also possible to adopt such an arrangement that omits the erasing transistor. More detailed arrangements and modified forms of such a non-destructive readout type image sensor cell usable in the present invention are disclosed, for example, in our copending U.S. patent application Ser. Nos. 254,046 filed Apr. 14, 1981, and 265,393 filed May 20, 1981. In the present invention, the non-destructive readout image sensor cell can be employed regardless of whatever structure it may have.

Figure 4:
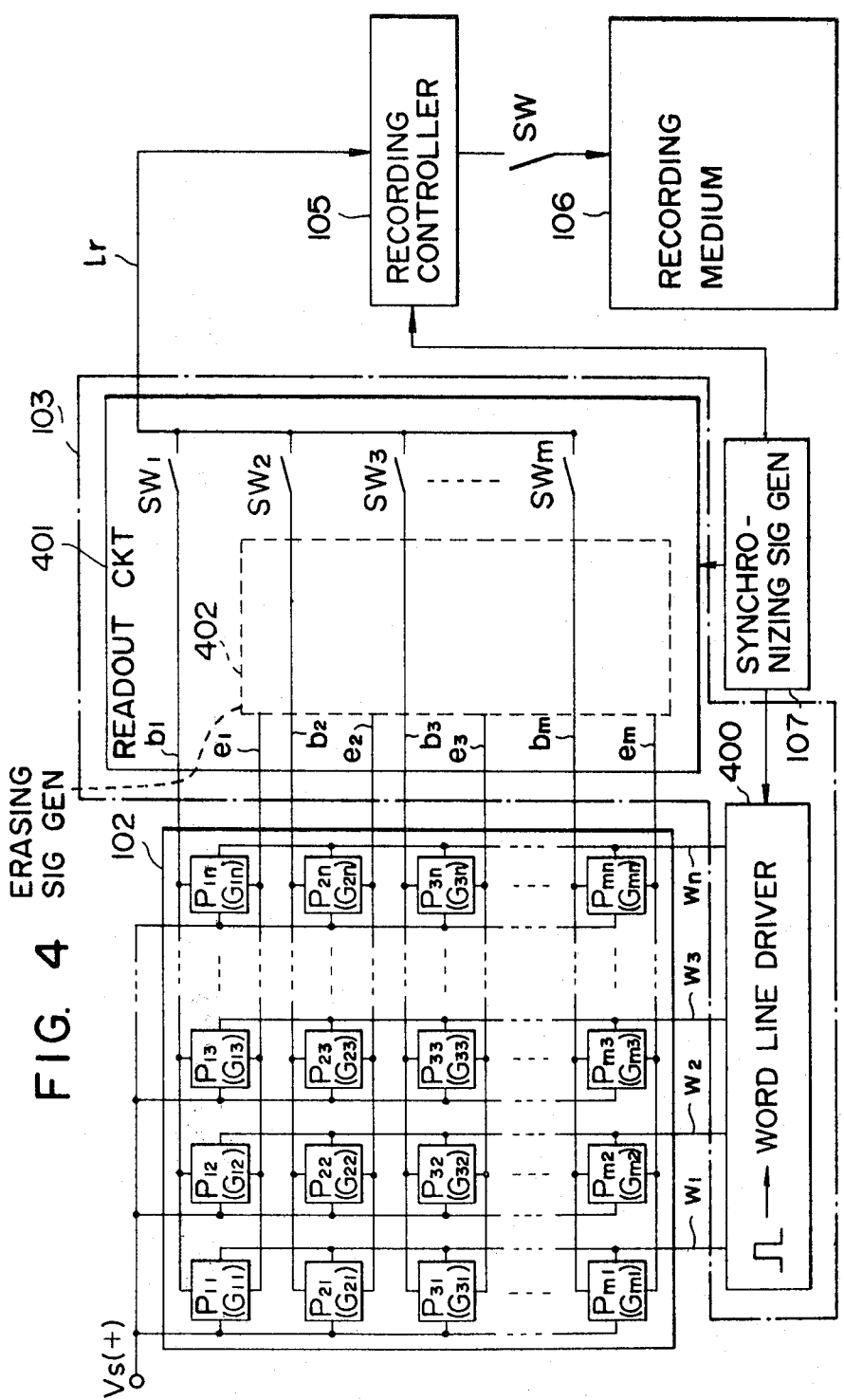
FIG. 4 is a block diagram illustrating the principal part of an embodiment of the present invention which employs a photoelectric converter constituted by a plurality of such image sensor cells as shown in FIG. 2.

FIG. 4 illustrates in block form the principal part of an embodiment of the present invention which employs the photoelectric converter 100 using the image sensor cell of FIG. 2 as a basic picture element. In FIG. 4, the part corresponding to those in FIGS. 1, 2 and 3 are identified by the same reference numerals and characters. Reference characters $P_{11}$ to $P_{mn}$ indicate image sensor cells; $G_{11}$ to $G_{mn}$ designate their image information; 400 identifies a word line driver; $w_1$ to $w_n$ denote word lines; 401 represents a readout circuit; 402 shows an erasing signal generator; $b_1$ to $b_m$ refer to bit lines; $e_1$ to $e_m$ indicate erase lines; SW designates a connector; and lr identifies a video readout line. The erasing signal generator 402 is to erase each image information by sending out an erasing signal on each of the erase line $e_1$ to $e_m$ and the synchronizing signal generator 107 generates various control signals for the image sensor including the word line driver 400, the readout circuit 401 and the recording controller 105.

The word line driver 400 applies pulse voltages to the word lines $w_1$ to $w_n$ at predetermined timing to sequentially select vertical picture element trains shown in FIG. 4. Stored information of the image sensor cells thus selected are provided on the bit lines $b_1$ to $b_m$ connected thereto. In the readout circuit 401, the bit lines $b_1$ to $b_m$ are respectively connected with the main analog switches $SW_1$ to $SW_m$, which are, in turn, connected with the image signal readout line lr. Accordingly, it is possible to read out stored information of a desired image sensor cell by the word line driver 400 and the main analog switches $SW_1$ to $SW_m$. By their operation the image sensor cells are scanned to read out their stored information. In this case, it is also possible to adopt such an arrangement in which pluralities of main analog switches and image signal readout lines are connected to each of the above bit lines and the scanning is performed in such a manner that stored information of each image sensor cell is read out together with stored information of other image sensor cells bearing predetermined positional relationships to the image sensor cell desired to read out, whereby the signal read out is subjected to image processing for improvement of its image quality.

Such scanning as described above is executed a plurality of times for the same image formed on the photoelectric conter 102. The individual image information thus read out is sequentially provided to the recording controller 105 for recording on the recording medium 106. The number of repetitions of the readout recording-operation is determined taking into consideration the performance of the recording and reproducing device, the quality of the recording medium, the required image quality of the reproduced image and so forth. Incidentally, it is optional whether the recording is performed on an analog or digital recording system and what modulation system is employed. In the case of using a magnetic tape as the recording medium 106, it is necessary that the recording controller 105 be equipped with all functions necessary for at least recording, such as a magnetic tape drive motor, a motor control circuit, a video head and so forth. These functions are well-known ones.

Figure 5:
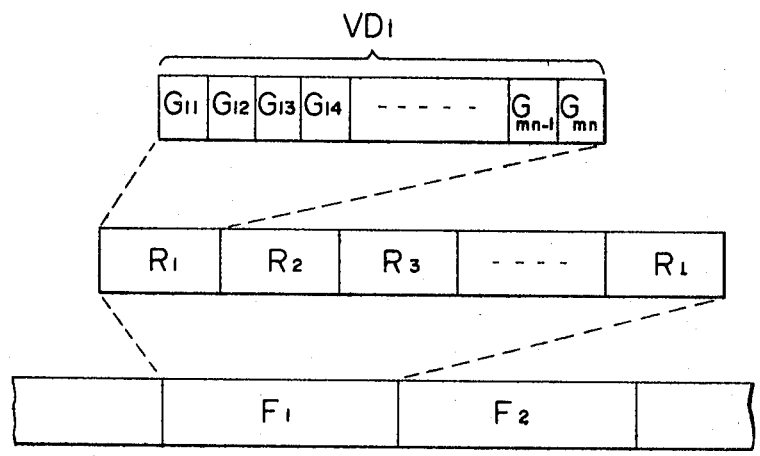
FIGS. 5 and 6 are schematic diagrams showing examples of tape formats for recording image information on a magnetic tape.
Figure 6:
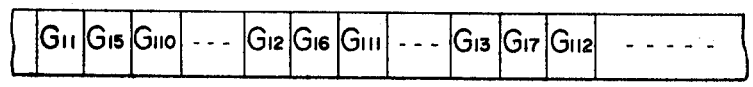

FIGS. 5 and 6 show, by way of example, tape formats for recording image signals on a magnetic tape. FIG. 5 illustrates a method according to which image information $VD_1$ (consisting of the image information $G_{11}$ to $G_{mn}$ read out as a time series signal) first read out by scanning the image sensor cells $P_{11}$ to $P_{mn}$ in this numerical order is recorded in a certain area $R_1$ of a track on the magnetic tape and image information $VD_2$ to VD subsequently read out are sequentially recorded in areas $R_1$ to $R_l$ following the area $R_1$. In this case, the data recorded in the areas $R_1$ to $R_l$ constitute a recording unit $F_1$ of one picture. Generally in the magnetic recording device, a random noise represented by noise resulting from tape travel occurs at random in terms of space as well as time, so that it is effective to record the image information a plurality of times.

The method shown in FIG. 6 makes use of the random access property of the photoelectric converter used in the present invention. According to this method, image sensor cells spaced apart on the photoelectric converter are read out using a predetermined algorithm for sequential recording of their image information; thus the image information of adjoining image sensor cells is recorded discretely on the magnetic tape. In general, a burst noise represented by dropout in the magnetic recording device occurs at random but the resulting error has continuity, so that deterioration of the image quality by the burst error can be prevented by such recording method. Accordingly, a reproduced picture of higher quality can be obtained by the combined use of this method and the plural recording and by averaging or like processing described later.

The same effect as described above can also be produced by simultaneous recording on a plurality of tracks by one readout operation through the use of a plurality of magnetic heads. However, a device for such a method is expensive. Furthermore, as the readout operation is performed only once in such a method, noises such as thermal noise occurring in the photoelectric converter and the readout circuit and induced noise resulting from a parasitic capacitance are not alleviated. In contrast thereto, in the present invention adopting plural readout and plural recording, such noises can also be alleviated.

The recording medium 104 having recorded thereon the image information of the same image can be detached from the body of the image storage device through the connector SW. By installing the recording medium 104 on a reproducing device, a reproduced picture can be obtained.

Figure 7:
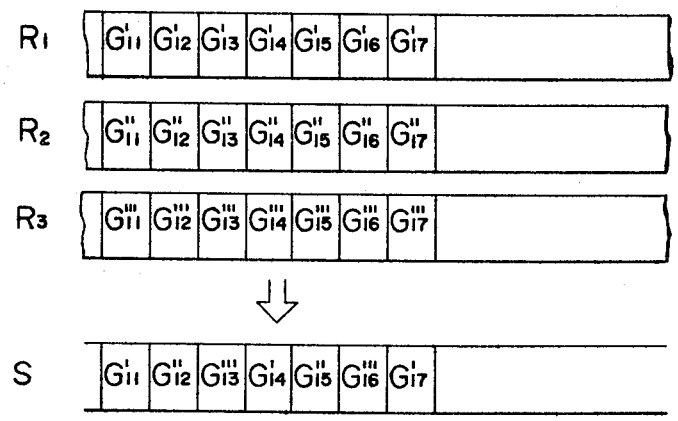
FIGS. 7 and 8 are schematic diagrams explanatory of reproduction of image information.
Figure 8:
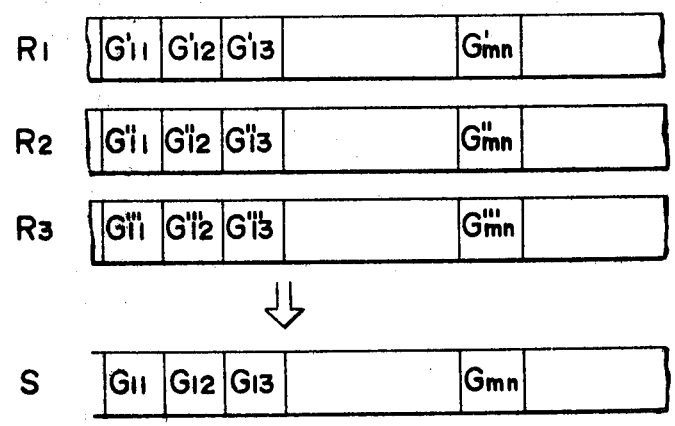

FIGS. 7 and 8 are explanatory of different reproducing methods for reproducing the image information recorded a plurality of times as described above. In accordance with the method of FIG. 7, image data $G_{11}'$, $G_{14}'$, $G_{17}'$, ..., $G_{12}''$, $G_{15}''$, ... and $G_{13}'''$, $G_{16}'''$ ... are read out from the areas $R_1$, $R_2$ and $R_3$, respectively, that is, the image data of, for example, individual picture elements recorded in the different areas $R_1$, $R_2$ and $R_3$, respectively, are read out therefrom using a predetermined algorithm and the image data are combined to obtain reproduced image data S. With this method, even if burst errors exist, for example, in the data $G_{15}''$ to $G_{17}''$ of the area $R_2$, the error in the data $G_{15}''$ alone appears in the output image. Therefore, this method is suitable for use in the case of using, as an output display unit, a TV display or the like for which the image quality need not be so high. The algorithm for sampling the areas $R_1$ to $R_3$ is not limited specifically to the abovesaid but may be an arbitrary one.

According to the method of FIG. 8, information of the same picture element recorded in the areas $R_1$ to $R_3$ is read out therefrom respectively and its averaged information is used as reproduced image information. Letting image information of the same image sensor cell recorded in the areas $R_1$ to $R_3$ be represented by $G_1$ to $G_l$, respectively, reproduced image information $G_S$ is given by the following expression:

$$G_S = \frac{G_1 + G_2 + \ldots G_l}{l} \quad (2)$$

where l is the number of recording. With this method, an error is reduced down to $1/\sqrt{\text{the number of averaging}}$ (l), hence this method is suitable for use with an output display device which calls for high image quality, such as a hard copy device or the like.

Furthermore, since the presence of the dropout can easily be detected by lowering of the output level, it is also possible to obtain a reproduced image directly from data recorded in dropout-free areas or by subjecting them to the abovesaid averaging process, without using data recorded in the areas $R_1$ to $R_l$ in which the dropout is detected.

In the case of applying the present invention to a color image storage device, readout and plural recording of image information can be performed for each color by utilizing the random access property of the photoelectric converter.

As has been described in the foregoing, according to the present invention, as the photoelectric converter is formed by non-destructive readout image sensor cells and image information of the same image produced on the photoelectric converter is read out a plurality of times and recorded, various reproducing methods such as described previously can be adopted, permitting marked improvement of the image quality of a reproduced image. Accordingly, even if the recording medium and the recording and reproducing device employed are relatively low-grade, an excellent reproduced image can be obtained, so that photographic equipment can be made inexpensive; moreover, the photographic equipment can be miniaturized, enabling realization of a portable two-dimensional solid-state image storage device or the like having a recording unit incorporated in the image sensor. Especially, in the present invention, as the photoelectric converter is constituted by non-destructive readout image sensor cells, image information can be read out therefrom a plurality of times without using a buffer memory or the like, allowing further miniaturization of the image storage device and reduction of its cost.

It will be apparent that many modifications and variations may be effected without departing from the scope of the novel concepts of this invention.

We claim:
1. A solid-state image storage device comprising:
a photoelectric converter having a plurality of non-destructive readout image sensor cells arranged in one of a line and a matrix for receiving an image;
a scanner for scanning the photoelectric converter to read out image information of the plurality of image sensor cells; and
a recorder having a recording medium for recording the image information read out by the scanner from the plurality of image sensor cells;
wherein the scanner has means so that the operation of reading out the image information of all of the plurality of image sensor cells by the scanner is carried out a plurality of times to obtain a plurality of image informations on the same image formed on the photoelectric converter, and the plurality of image informations thus read out are respectively recorded at different positions on the recording medium of the recorder.

2. A solid-state image storage device according to claim 1 wherein the non-destructive readout image sensor cells are photoelectric conversion elements, each having a hook structure.

3. A solid-state image storage device according to claim 1 wherein the scanner includes a word line driver for sequentially selecting picture element trains, each train consisting of a plurality of the image sensor cells arranged in a column direction on the photoelectric converter; a plurality of bit lines for taking out the outputs from the image sensor cells of each picture element trains selected by the word line driver; a plurality of analog switches for connecting the bit lines to an image signal readout line; and a synchronizing signal generator for performing ON-OFF control of the analog switches and control of the word line driver.

4. A solid-state image storage device according to claim 1 wherein the recorder records the image information of the same image on the recording medium in such a manner that image information read out first is recorded in an area on a track followed by image information read out subsequently being recorded in those areas of the same track contiguous to the area having recorded therein the first read out image information.

5. A solid-state image storage device according to claim 1 wherein the scanner scans the image sensor cells of the photoelectric converter at intervals using a predetermined algorithm to read out image information of all the image sensor cells at a plurality of times, and the recorder records the image information at different positions on the recording medium.

6. A solid-state image storage device according to claim 2, wherein said recorder is a magnetic medium recorder, said recording medium comprising a magnetic recording medium.

7. A solid-state image storage device according to claim 2, wherein said hook structure comprises first region (201) for receiving a radiant energy, a high resistivity second region (202), a low resistivity third region (203) of a first conductivity type and a low resistivity fourth region (204) of a second conductivity type reverse from the first conductivity type, the first to fourth regions being sequentially formed on a semiconductor substrate from the main surface thereof towards the inside thereof, a readout transistor ($Q_1$) using the fourth region of the hook structure as one of its main electrodes, and an erase transistor ($Q_2$) using the third region of the hook structure as one of its main electrodes.

8. A method of recording image information using a solid-state image storage device, comprising:

providing a photoelectric converter having a plurality of non-destructive readout image sensor cells arranged in one of a line and a matrix;

permitting a light image to shine on the photoelectric converter to form image information in the plurality of non-destructive readout image sensor cells;

scanning the photoelectric converter to read out information from the image sensor cells a plurality of times; and recording the information on a recording medium each time the image information is scanned, on a separate portion of the recording medium, so that the image information can be regenerated from a plurality of recorded versions of the image information.

* * * * *